United States Patent [19]

Abbagnaro

[11] Patent Number: 4,768,699

[45] Date of Patent: Sep. 6, 1988

[54] QUICK START DESOLDERING METHOD AND APPARATUS

[75] Inventor: Louis A. Abbagnaro, Silver Spring, Md.

[73] Assignee: Pace Incorporated, Laurel, Md.

[21] Appl. No.: 117,291

[22] Filed: Nov. 6, 1987

[51] Int. Cl.⁴ .................. B23K 31/02; B23K 37/00
[52] U.S. Cl. ................... 228/102; 228/191; 228/264; 228/20; 219/240
[58] Field of Search .............. 228/102, 191, 264, 20, 228/46; 219/240

[56] References Cited

U.S. PATENT DOCUMENTS 4,056,334 11/1977 Fortune .................. 228/20 HT
4,117,967 10/1978 Regelson et al. ......... 228/20 HT

FOREIGN PATENT DOCUMENTS 159268 7/1986 Japan .................. 228/20 HT

Primary Examiner—Nicholas P. Godici
Assistant Examiner—Samuel M. Heinrich
Attorney, Agent, or Firm—Gerald J. Ferguson, Jr.

[57] ABSTRACT

A desoldering method and apparatus for removal of molten solder from joined parts including a desoldering tool; a vacuum pump connected to the desoldering tool for applying vacuum thereto for removing the solder; a motor for energizing the pump; and circuitry for providing an initial, relatively high, voltage to the motor and for thereafter providing a relatively lower voltage to the motor so that, during the application of the high voltage to the motor, a relatively large pulse of the vacuum is applied to the joined parts to (a) effect removal of substantially all of the molten solder into the desoldering tool and (b) initiate cooldown of the parts and, during the application of the lower voltage to the motor, a relatively lower vacuum is continuously applied to maintain the cooldown of the parts.

10 Claims, 3 Drawing Sheets

QUICK START DESOLDERING METHOD AND APPARATUS

FIELD OF THE INVENTION

The present invention relates generally to desoldering methods and devices and more particularly to a method and apparatus for applying a relatively large, initial vacuum pulse to a joint to be desoldered followed by a steady state application of a lower level vacuum.

BACKGROUND OF THE INVENTION

Devices suitable for use in removing modular electronic components from a substrate such as a printed circuit board include those which supply heat to solder which is to be melted, and then remove the molten solder by application of vacuum. The speed with which the solder removal takes place is important in successful removal of, for example, electronic components from printed circuit boards because quick removal of the solder promotes removal of as much of the solder that can be removed. With slow removal, it is more difficult to remove the solder. Moreover, slow removal tends to result in clogging of the molten solder removal path.

An example of a desoldering tool known in the prior art is that in U.S. Pat. No. 3,392,897, which is illustrated in prior art FIG. 1. The present invention is usable with such a desoldering tool such as that shown in prior art FIG. 1, which is briefly described as follows. The desoldering tool 10 includes a removable tubular tip 11 communicating with a metallic riser tube 12. The metallic tube 12 opens into an interior of a solder catcher tube 13. The solder catcher tube 13 is enclosed within a coaxially disposed handle 14. Solder is drawn into the interior of the tube 13 by vacuum applied from tube 17 through conduit 16 behind base member 15. An electrical cord 18 supplies electrical current to a heating element of the desoldering device.

Other prior art devices relate to quick starting operation of an apparatus for providing a source of vacuum. For example, U.S. Pat. No. 4,532,670 to Fortune discloses a device connected between a constant source of vacuum and a desoldering device which serves to boost the degree of vacuum at the desoldering tip upon initial actuation of the vacuum release trigger to facilitate rapid removal of the melted solder. Fortune, however, employs a spring loaded piston to supply an initial pulse of vacuum to the joint. However, this initial pulse is not followed by a steady state application of the vacuum which is needed to effect cooldown of the terminal to thus prevent possible re-sweating of the joint and possible overheating of adjacent components.

U.S. Pat. No. 4,643,776 to Hollowell et al. discloses connecting a 12 volt vacuum pump motor of a battery powered vacuum leaf collector in series with two 12 volt batteries to energize the motor with 24 volts to thereby increase the speed of the motor to provide a higher degree of suction for heavier loads. For lighter loads, the batteries are connected in parallel to provide 12 volts.

Of importance in desoldering is the requirement that the desoldering tip should assume a nearly exactly perpendicular position with respect to the work (typically a circuit board) in order to promote a good seal (e.g., about a plated-through-hole which is filled with a plug of solder) so that molten solder can be aspirated completely, thereby freeing the solder joint. For this purpose, a relatively large, initial vacuum pulse is needed to substantially completely remove the plug of solder while it is still molten.

Further, successful desoldering generally requires continued application, after the initial impulse, of a steady state vacuum to allow the joint to cool down below the solder melt temperature and prevent the formation of a re-sweat joint. Thus, quick removal of molten solder, without stalling of the vacuum pump motor, followed by the application of a steady vacuum avoids unnecessary repeated desoldering operations.

SUMMARY OF THE INVENTION

It is therefore an object of the present invention to provide an improved solder extractor for rapidly removing melted solder.

It is another object of the present invention to provide an improved desoldering method and apparatus wherein the vacuum source includes a means for the rapid starting thereof.

It is a further object of the present invention to provide a desoldering apparatus including an electrical circuit for supplying a predetermined, relatively higher, voltage to a vacuum pump motor for a relatively short, predetermined period of time to produce a relatively large vacuum pulse to quickly remove molten solder and thereafter supplying power to the vacuum pump motor at a relatively reduced voltage to effect steady state vacuum application and thus joint cooldown.

It is a further object of the present invention to provide a motor voltage supply for a source of vacuum connected to a desoldering tool which is capable of supplying a relatively strong initial burst of power to a motor of a vacuum pump which is sufficient to prevent stalling of the motor during initial removal of molten solder.

It is a still further object of the present invention to provide a control for a power supply to a vacuum pump connected to a desoldering tool, such that upon triggering of the circuit a relatively high voltage is supplied to the motor to provide a relatively high initial burst of vacuum to rapidly remove solder, and to provide, after the initial burst, a relatively lower voltage for continued operation of the desoldering tool which in turn causes relatively rapid cooling of the desoldered joint, to prevent resweating and reconnection of desoldered parts.

It is a still further object of the present invention to provide an improved desoldering device usable with prior art solder extractors.

The apparatus according to the present invention may include a prior art solder extractor such as that shown in FIG. 1, which according to the present invention has a vacuum pump motor for controlling a source of vacuum connected to the extractor. The motor is initially connectable to a relatively high voltage source, and after a predetermined time interval, is connected to a relatively lower voltage source to provide a lower, continuous motor operating power level. The vacuum source motor is, according to the present invention, preferably a D.C. motor although other motors such as a universal motor may also be employed. The motor according to the present invention preferably operates a diaphragm vacuum pump, although other pumps such as rotary vane pumps may also be employed.

The invention includes a circuit for supplying the relatively high voltage of typically 24 volts for a predetermined period of time to the vacuum pump motor. The higher initial voltage provides a relatively high initial torque to the motor, which is advantageous in providing a relatively strong initial vacuum sufficient to dislodge a plug of melted solder from a plated through hole, for example, in a printed circuit board. Upon removal of the plug of melted solder, a lower power supply of voltage can be provided for continued operation of the vacuum pump. The continued operation of the vacuum pump is advantageous in cooling a desoldered joint to prevent resweating and reconnection of the desoldered elements. Such reconnection or resweating may otherwise be caused due to the presence of even small amounts of remaining solder which has not been removed during the desoldering operation. Due to the opening of the through hole after removal of the solder plug therefrom, a high torque is no longer necessary.

Other objects and advantages of this invention will be apparent from a reading of the following specification and claims taken with the drawing.

DETAILED DESCRIPTION OF A PREFERRED EMBODIMENT OF THE INVENTION

Figure 1:
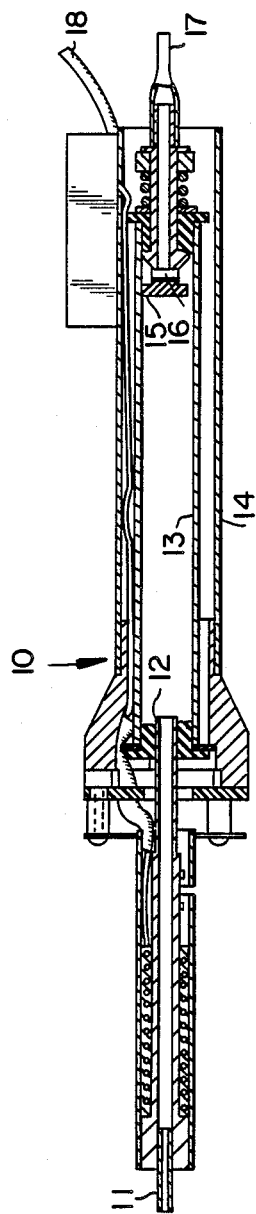
FIG. 1 is a side sectional view of a solder extractor according to the prior art, which is usable with the apparatus according to the present invention.

A prior art type of desoldering tool is illustrated in FIG. 1, and such tool is usable in the combination according to the present invention. A tip 11 can be pressed against a printed circuit board for removal of solder therefrom. The solder travels, as described hereinabove, to a solder catcher tube 13 which is connected to a source of vacuum (not shown in FIG. 1).

Figure 2:
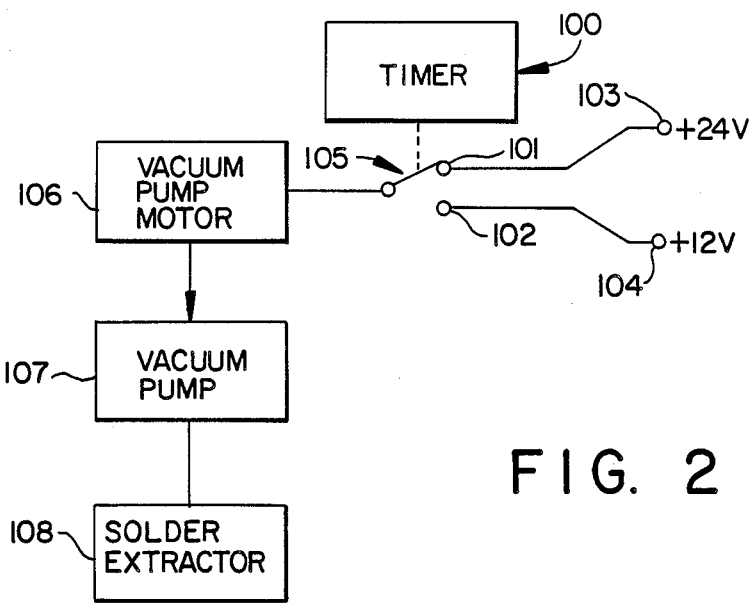
FIG. 2 is a schematic diagram indicating the relationship of major elements according to the present invention.

FIG. 2 schematically shows the relationship of major elements in the combination of the present invention. As seen in FIG. 2, a timer 100 causes switching of a switch 105 between a first D.C. voltage source 103 at typically 24 volts via a contact 101, and a second D.C. voltage source 104 at typically 12 volts via a contact 102. An external switch 20 (shown in FIG. 4) enables current to flow from the voltage sources 103 and 104, and to operate the timer 100.

A motor 106 such as a 12 volt D.C. motor receives power from either the voltage source 103 or the voltage source 104 when the external switch 20 has been closed. When the switch 20 is open, no power is supplied to the motor 106. The timer initially supplies voltage to the motor 106 at the supply voltage of +24 volts via contact 101 in FIG. 2. After a relatively short period of time the switch 105 causes the voltage supplied to the motor 106 to be supplied via contact 102 so that the +12 volt supply voltage becomes the source of power for the motor 106. Thus, for the relatively brief period of time, a relatively high voltage of +24 volts energizes the motor 106, providing a relatively high initial torque to cause rapid start-up and to overcome any initial resistance of a plug of solder to flow, thereby avoiding stalling. After the initial start-up period, the motor runs continuously thereafter at a power supply voltage of +12 volts. This avoids running the pump 107 at too high a speed for a prolonged period of time which will tend to shorten the pump life and which will also tend to cause the pump to fibrillate and thus impair pumping action.

The 12 volt D.C. motor 106 actuates a pump 107 such as a diaphragm pump which is schematically indicated in FIG. 2. Such diaphragm pumps are well-known and any other suitable pump such as a rotory vane could be used with the present invention. Such pumps would be chosen and sized by anyone having skill in this art to which the invention pertains.

The vacuum pump 107 provides a source of vacuum to a solder extractor 108 which is indicated schematically in FIG. 2 which extractor may be of any known type.

Figure 3:
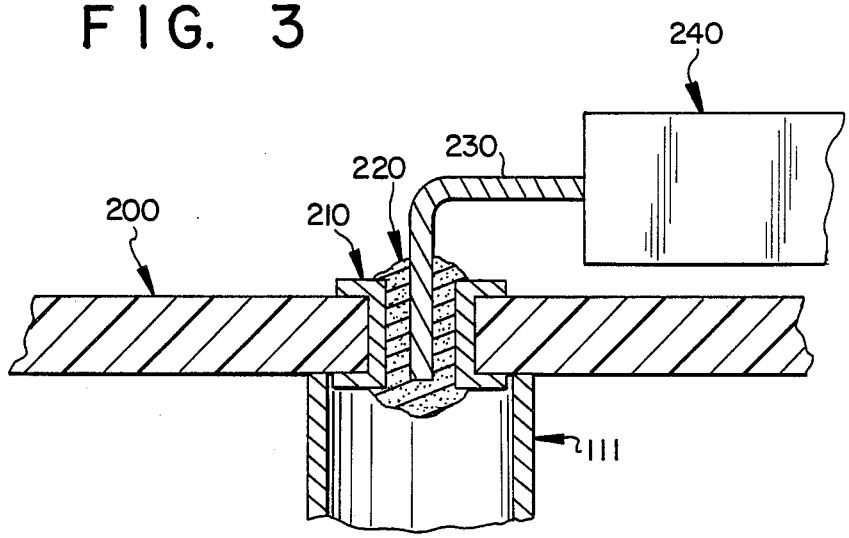
FIG. 3 is a side sectional view illustrating application of a desoldering tip to a soldered joint in a printed circuit board.

FIG. 3 is a side sectional view illustrating the application of a desoldering tip 111 to a soldered joint 220 in a printed circuit board 200. The parts are not drawn to scale in FIG. 3, but rather have been drawn for clarity and to clearly depict the operation involved.

In FIG. 3, a circuit element 240 is connected to printed circuit board 200 by a lead 230. The lead 230 is electrically connected to a plated-through-hole 210 by a plug of solder 220. As seen in FIG. 3, the plug of solder is solid, and can be melted by the application of the heated tip 111 of the desoldering tool 108. The printed circuit board 200 in this figure is composed of an insulating material as is conventional in the printed circuit board art. The plated-through-hole 210 is preferably composed of a conductive material such as metal for establishing a good electrical contact. The plated through hole 210 may, as is known in the prior art, be electrically connected to other components or other portions of the printed circuit board which are themselves electrically conductive.

Upon sufficient application of heat to the solder 220 via the tip 111, the solder 220 is made to melt. This condition can readily be detected by direct observation of the solder 220 by a human operator. Upon detection of melting of the solder 220, the operator triggers a switch 20 (shown in FIG. 4) such as a foot pedal, hand-operated trigger, or the like, to initiate operation of the vacuum source at a relatively high initial start-up voltage. Upon the initial start-up of the vacuum source the molten plug of solder 220 is drawn through the tip 111 into the desoldering tool 108.

The initial pulsation of vacuum quickly removes the solder at the joint and thus no opportunity is provided whereby the solder may clog the riser tube 12. The vacuum is not applied until the heater has heated the solder to be removed above its solder melt temperature.

Moreover, during the initial vacuum pulse, cooldown of the joint is initiated to thus minimize the chances of damage occurring to the circuit board. Furthermore, this initiation of cooldown, which is maintained after the initial pulse is removed, minimizes the chances of the electrical terminal 20 resweating to the plated-through-hole, for example. That is, it is impossible to remove all of the solder forming the joint and thus, if the lead 230 and plated-through-hole 210 are maintained at a temperature which is above the solder melting temperature, there is a possibility the electrical terminal 230 can resweat or reconnect to the plated-through-hole 210.

Moreover, after the initial vacuum pulse is applied, the operation of the motor 106 and pump 107, the operator will likely leave the tip 111 in contact with the joint even though most of the solder has been removed. Thus, it is desirable that the vacuum be applied for a period of time after the pulse has been applied in order to maintain the cooling of the lead and hole initiated during the pulse. In this manner, cooldown of the joint will be maintained until the operator can remove the tip therefrom. This feature is incorporated in the present invention whereby the initial vacuum pulse is effected by application of the 24 Volt power source 103 supplied to the motor 106 while the cool down is maintained after the motor 106 is switched to the 12 volt source. This is in contradistinction to the prior art mechanical devices wherein a vacuum pulse is applied by a plunger mechanism or the like. That is, in the prior art, cool down is effected only during the very short time the pulse is applied. Afterwards, continued application of the heater tip to the joint will enhance the probability that the lead will resweat to form the joint again even though much or most of the solder has been removed. Hence, the electrical implementation, of a desoldering operation according to the present invention, with its transient and steady state modes of operation, is particularly advantageous over the mechanical devices having transient modes of operation only.

The initial vacuum pulse preferably causes the vacuum at the tip of the solder extractor to rise from zero inches of Hg (atmospheric pressure) to at least 10 inches of Hg in a time period (or rise time) preferably less than about 140 milliseconds although the time period can, at a maximum, be about 200 ms. With the present invention, rise times of about 110–120 ms. have been obtained and depending on the particular motor, the particular vacuum pump, the amount of space to be evacuated (including, for example, tube 17, solder catcher tube 13, riser tube 12, etc.), and, in accordance with the present invention, the magnitude of the initial voltage applied to the motor, the rise time can be reduced to substantially smaller values such as 50 ms., for example. The foregoing will be further discussed below after a discussion of the timing and switching circuit of FIG. 4.

Figure 4:
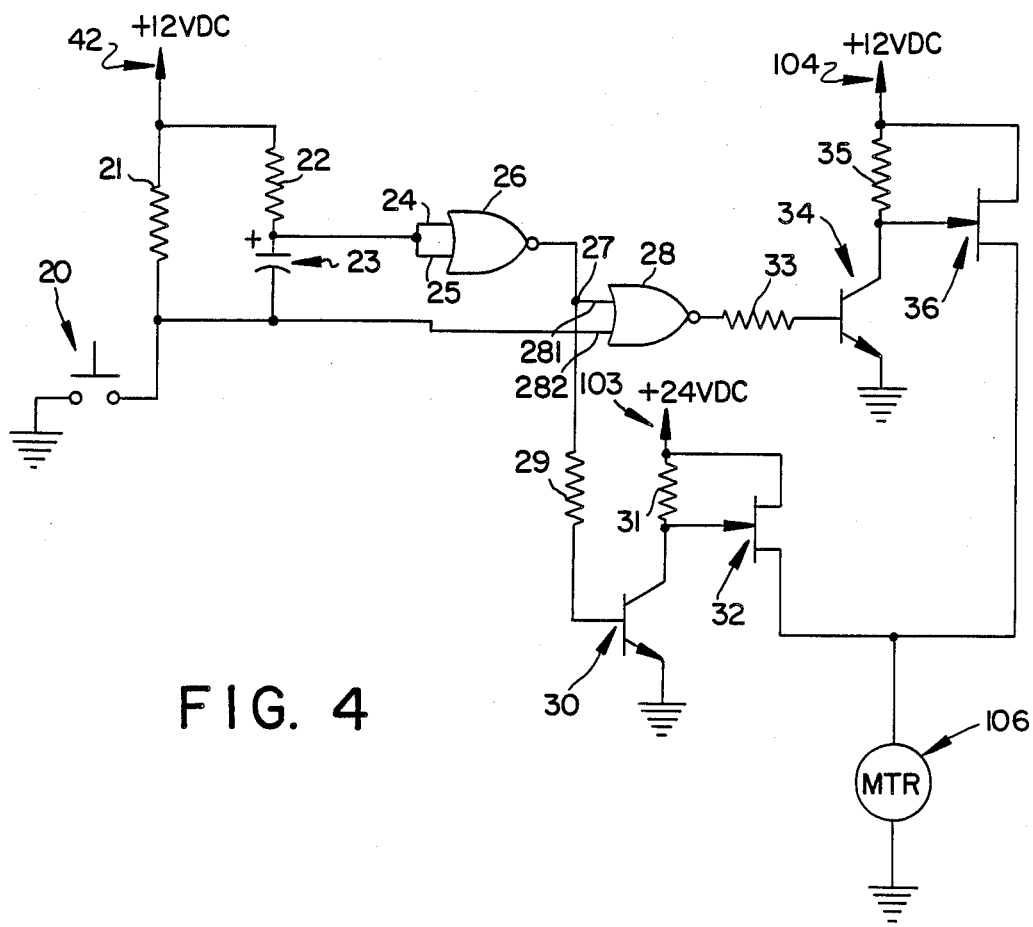
FIG. 4 is an electrical schematic diagram illustrating circuit elements in a configuration suitable for use in the present invention.

FIG. 4 is an electrical schematic diagram which may be used to implement the timing function of timer 100 of FIG. 2. The circuitry of FIG. 4 includes 24 volt source 103 and 12 volt source 104 respectively illustrated in FIG. 2. The circuitry further includes a switch 20 which when closed initiates the timing cycle of circuit 100. Switch 20 is connected to a 12 volt D.C. source 42 through a 10K resistor 21, the source 42 also being connected to an RC timing circuit comprising 10K resistor 22 and 22 μF capacitor 23, it being understood all component values and designations are illustrative and other appropriate values may be employed as required in a particular application.

The capacitor is connected to both inputs 24 and 25 of a CD4001A NOR gate 26 whereby the gate functions as an inverter. The output of the inverter is applied to an input 281 of a CD4001A NOR gate 28 via a connection 27, the inverter 26 output also being applied to the base of a 2N2222 transistor 30 via 10K resistor 29.

The emitter of the transistor 30 is grounded while the collector thereof is connected to 24 volt source 103 via 10K resistor 31, the collector also being connected to the gate of a RFP8P08 JFET 32. The source of the JFET is also connected to 24 volt source 103 while the drain thereof is connected to pump motor 106, which preferably is a 12 volt diaphragm motor.

Switch 20 is also connected to an input 282 of NOR gate 28, the output of the NOR gate being connected to a 2N2222 transistor 34 via 10K resistor 33 where the emitter of the transistor is grounded and the collector thereof is connected to (a) the 12 volt source 104 through a 10K resistor 35 and (b) the gate of a RFP8P08 JFET 36. The source of the JFET is connected to the 12 volt source while the drain thereof is also connected to motor pump 106.

The timing circuit is inoperative until switch 20 is depressed. Prior to the depression of switch 20 the 12 volt source 42 is applied to input 282 of NOR gate 28 via resistor 21 to disable the gate. Thus, the output thereof is low whereby the transistor 34 is turned off. Accordingly, the 12 volts from source 104 is applied to both the source and gate of JFET 36 to turn the JFET off. Accordingly, no current flows to motor 106 from the 12 volt source.

Moreover, the 12 volt source 42 is inverted by inverter 26 to a low voltage which is applied to the base of transistor 30 to disable it whereby no current is also applied from 24 volt source 103 to motor 106, JFET 32 being turned off in the same manner as JFET 36 described above.

Upon closure of switch 20, ground (or logical low) is applied to both the input of inverter 26 and the input 282 of NOR gate 28. The inverter 26 inverts the ground voltage applied thereto to a logically high signal which in turn is applied to the input 281 of NOR gate 28 and the base of transistor 30. The application of the high signal to NOR gate 28 disables it and thus the lack of application of current from 12 volt source 104 is maintained. However, with the application of the high voltage to transistor 30 it is actuated to apply a ground voltage to the gate of JFET 32 thereby turning it on and connecting the 24 volt source 103 to the pump motor 106. Accordingly, motor 106 is now energized and will continue to be energized depending upon the values of the RC timing circuit 22, 23.

Initially, upon closure of switch 20, the voltage at both plates of capacitor 23 is zero or ground, as stated above. However, charging of capacitor 23 will commence immediately upon closure of the switch, the capacitor being charged from the 12 volt source 42 via resistor 22. As the capacitor charges, the voltage at the positive plate thereof increases until the output voltage at inverter 26 switches from logical high to logical low. This output voltage at which the switch from high to low occurs depends on the particular circuitry used and may typically range from about 5 to 7 volts. Once the output of inverter 26 switches from logical high to logical low, transistor 30 is cut off and is thus returned to its initial state when switch 20 was open. Accordingly, the 24 volt source is removed from the pump motor 106.

However, at the same time, the application of the low voltage from inverter 26 to input 281 of NOR gate 28 conditions the gate to apply a logically high voltage to the base of transistor 34. That is, when the output of inverter 26 switches from logical high to logical low, both of the inputs of the NOR gate 28 will be at the logical low level (since switch 20 remains depressed to apply a logical low signal to input 282) and thus the output of the NOR gate is logical high. With the application of the logical high voltage to transistor 34, it is turned on to ground the gate of JFET 36. Accordingly, the 12 volt source will now be connected to the pump motor 136 to apply current thereto, the switching on of the JFET 36 being effected in the same manner as the switching on of JFET 32 discussed above.

It can thus be seen that depending upon the time constant of RC circuit 22, 23 the pump motor 106 is initially energized for a period of time related to the time constant of the RC circuit from the 24 volt source 103 and then subsequently energized from the 12 volt source 104. As long as switch 20 remains depressed, the motor will continue to be energized from the 12 volt source 104. When switch 20 is released, capacitor 23 will discharge through resistors 22 and 21 whereby the FIG. 4 circuit will be returned to the state described above prior to actuation of switch 20. Accordingly, motor 106 will no longer be energized.

As stated above, the vacuum at the extractor tip should rise from zero inches of Hg to at least 10 inches of Hg in a time period (or rise time) preferably less than about 140 miliseconds. The time constant of the RC circuit 22, 23 should preferably be at least as long as the rise time. Thus, in the circuit of FIG. 4, the rise time is about 150 ms, which exceeds the 140 ms rise time. That is, there is no need to run the pump motor at the higher voltage once the desired vacuum level has been reached although it should not be run at the high voltage for too long since impairment of pump operation may result as discussed above. Hence, because of the present invention, the desired vacuum level (preferably at least 10 inches of Hg) is rapidly reached due to the initial application of the larger voltage to the pump motor. Moreover, due mainly to the fact that the desired vacuum level is reached so rapidly, removal of substantially all of the solder from the joint is effectively insured. Of course, if in certain applications, the desired vacuum level is less than 10 inches of Hg, this level may be employed as the level to be reached within the desired rise time.

As stated above, the desired vacuum level of at least 10 inches of Hg is rapidly reached due to the initial application of the larger voltage to the pump motor. As also discussed above, the rise time can also be reduced depending on the particular motor and pump and the amount of space to be evacuated. Assuming the amount of space to be evacuated has been reduced to its lowest practical level, or at least is substantially constant, the rise time is mainly a function of the type of motor and pump and, in accordance with the present invention, the amount of initial voltage applied to the motor.

If a relatively large rotary vane pump were used with a synchronous motor and, the principles of the present invention were not utilized, a rise time of about 150 ms to at least 10 inches of Hg can be obtained. However, the above combination of pump and motor is relatively expensive and, moreover, the sliding vanes of the pump tend to become gummy due to flux gases and the like drawn into the pump over an extended period of desoldering operations. A much less expensive combination of motor and pump would be a diaphragm pump such as that sold by Pace under the designation of 1336-0020 and small 12 volt D.C. motor such as that sold by Mabuchi under the designation of RS-555SH. Moreover, the above pump is subject to less contamination and typically generates less noise than a rotary vane pump. However, without utilizing the principles of the present invention, this combination of motor and pump is able to effect a rise time to 10 inches of Hg in only about 220 ms. Such a rise time is too slow to insure effective removal of a solder joint, as discussed above. However, with the brief of application of 24 volts to the 12 volt motor, the rise time is reduced to about 140 ms whereby the combination of a diaphragm pump and a D.C. motor is rendered very effective for purposes of rapid and complete solder removal. Accordingly, for the reasons given above, the latter combination of motor and pump are preferred in this invention although, as stated above, other combinations can be employed depending on the application.

It will be evident to those skilled in the art that many modifications may be made within the scope of the present invention without departing from the spirit thereof, and the present invention includes all such modifications.

What is claimed is:

1. A desoldering apparatus for removal of molten solder from joined parts, comprising in combination:
   a desoldering tool;
   a vacuum pump connected to said desoldering tool for applying vacuum thereto for removing said solder; and
   a motor for energizing said pump;
   means for applying an initial, relatively high voltage to said motor and for thereafter applying a relatively lower voltage to said motor so that, during the application of the high voltage to the motor, a relatively large pulse of said vacuum is applied to the joined parts to (a) effect removal of substantially all of the molten solder into the desoldering tool and (b) initiate cooldown of the parts and, during the application of the lower voltage to the motor, a relatively lower level vacuum is continuously applied to maintain cooldown of the parts.

2. A desoldering apparatus as in claim 1 where said vacuum pump is a diaphragm pump.

3. A desoldering apparatus as in claim 1 where said vacuum pump is a rotary vane pump.

4. A desoldering apparatus as in claim 1 where said motor is a D.C. motor.

5. A desoldering apparatus as in claim 1 where said motor is a universal motor.

6. A desoldering apparatus as in claim 1 where the magnitude of said initial voltage is such that the vacuum at said joined parts rises from about zero inches of Hg to a predetermined level of Hg in a predetermined period of time.

7. A desoldering apparatus as in claim 7 where said predetermined level is at least about 10 inches of Hg.

8. A desoldering apparatus as in claim 8 where said predetermined period of time is less than about 200 ms.

9. A desoldering apparatus as in claim 8 where said predetermined period of time is less than about 140 ms.

10. A desoldering method for removal of molten solder from joined parts using a desoldering tool having a vacuum pump connected thereto, comprising the steps of:
    applying an initial, relatively high voltage to a motor to actuate the vacuum pump; and
    thereafter applying a relatively lower voltage to said motor;
    whereby, during the application of the high voltage to the motor, a relatively large pulse of said vacuum is applied to the joined parts to (a) effect removal of substantially all of the molten solder into the desoldering tool and (b) initiate cooldown of the parts and, during the application of the lower voltage to the motor, a relatively lower level vacuum is continuously applied to maintain cooldown of the parts.

* * * * *